United States Patent
Du et al.

(10) Patent No.: US 10,965,263 B2
(45) Date of Patent: Mar. 30, 2021

(54) DEGLITCHING CIRCUIT AND METHOD IN CLASS-D AMPLIFIER

(71) Applicant: STMicroelectronics (Shenzhen) R&D Co. Ltd., Shenzhen (CN)

(72) Inventors: Ru Feng Du, Shenzhen (CN); Qi Yu Liu, Shenzhen (CN)

(73) Assignee: STMICROELECTRONICS (SHENZHEN) R&D CO. LTD., Shenzhen (CN)

(*) Notice: Subject to any disclaimer, the term of this patent is extended or adjusted under 35 U.S.C. 154(b) by 0 days.

(21) Appl. No.: 16/354,760

(22) Filed: Mar. 15, 2019

(65) Prior Publication Data

US 2020/0295723 A1 Sep. 17, 2020

(51) Int. Cl.

| | |
|---|---|
| H03F 3/217 | (2006.01) |
| H03G 1/04 | (2006.01) |
| H03K 19/017 | (2006.01) |
| H03K 19/20 | (2006.01) |
| H03K 19/003 | (2006.01) |
| H03G 3/30 | (2006.01) |
| H03K 19/096 | (2006.01) |

(52) U.S. Cl.
CPC ............ *H03G 1/04* (2013.01); *H03F 3/2173* (2013.01); *H03G 3/3026* (2013.01); *H03K 19/00323* (2013.01); *H03K 19/01728* (2013.01); *H03K 19/096* (2013.01); *H03K 19/20* (2013.01); *H03F 2200/78* (2013.01)

(58) Field of Classification Search
CPC ...................................................... H03F 3/217
USPC .................................. 330/10, 251, 207 A
See application file for complete search history.

(56) References Cited

U.S. PATENT DOCUMENTS

| | | | |
|---|---|---|---|
| 7,315,202 B2* | 1/2008 | Tsuji | H03F 1/26 330/10 |
| 7,795,970 B2* | 9/2010 | Kaya | H03F 3/217 330/207 A |
| 7,965,141 B2* | 6/2011 | Dooper | H03F 3/217 330/10 |
| 8,212,612 B2 | 7/2012 | Song et al. | |
| 9,231,535 B2 | 1/2016 | Du et al. | |
| 9,306,523 B2 | 4/2016 | Du et al. | |
| 2006/0008095 A1 | 1/2006 | Tsuji | |

OTHER PUBLICATIONS

Texas Instruments, "TPA2010D1 2.5-W Mono Filter-Free Class-D Audio Power Amplifier", TPA2010D1, SLOS417D, Oct. 2003, 35 pages.

(Continued)

*Primary Examiner* — Henry Choe
(74) *Attorney, Agent, or Firm* — Slater Matsil, LLP

(57) ABSTRACT

In an embodiment, a class-D amplifier includes an input terminal configured to receive an input signal; a comparator having an input coupled to the input terminal; a deglitching circuit having an input coupled to an output of the comparator; and a driving circuit having an input coupled to an output of the deglitching circuit. The deglitching circuit includes a logic circuit coupled between the input of the deglitching circuit and the output of the deglitching circuit. The logic circuit is configured to receive a clock signal having the same frequency as the switching frequency of the class-D amplifier.

22 Claims, 11 Drawing Sheets

(56) References Cited

OTHER PUBLICATIONS

Texas Instruments, "9-W Stereo Class-D Audio Power Amplifier with Dc vol. Control", TPA3002D2, SLOS402C, Dec. 2002, 41 pages.
Texas Instruments, "3-W Stereo Class-D Audio Power Amplifier with Dc vol. Control", TPA3003D2, SLOS406A, Feb. 2003, 37 pages.
Texas Instruments, "6-W Stereo Class-D Audio Power Amplifier", TPA3005D2, SLOS427A, May 2004, 32 pages.
Texas Instruments, "10-W Stereo Class-D Audio Power Amplifier", TPA3008D2, SLOS435C, May 2004, 33 pages.

* cited by examiner

PRIOR ART

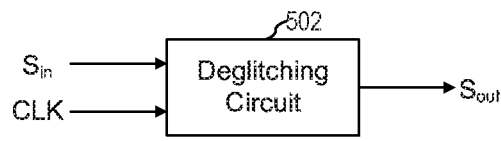
FIG. 5A
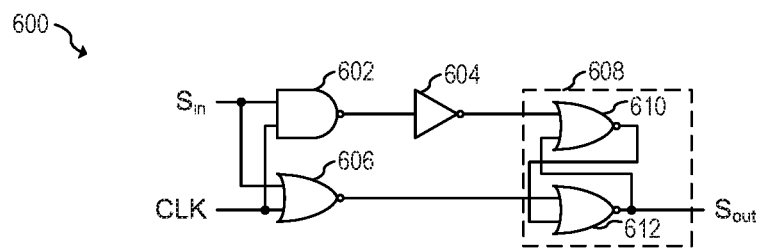
FIG. 5B
FIG. 6

DEGLITCHING CIRCUIT AND METHOD IN CLASS-D AMPLIFIER

TECHNICAL FIELD

The present invention relates generally to an electronic system and method, and, in particular embodiments, to a deglitching circuit and method in a class-D amplifier.

BACKGROUND

A class-D amplifier is a switching amplifier that operates the output transistors as electronic switches instead of in the linear region. FIG. 1 shows a schematic diagram of conventional class-D amplifier 100 for driving audio speaker 114. Class-D amplifier includes comparator 102, drive circuit 104, output stage 105, inductor no, and capacitor 112.

During normal operation, comparator 102 receives audio input signal 116 and triangular waveform 118 (e.g., a sawtooth waveform) and generates pulse-width modulation (PWM) signal 120. PWM signal 120 is used to control drive circuit 104, which in turn drives transistors 106 and 108 of output stage 105 based on PWM signal 120. Output stage 105 produces output signal 122, which drives speaker 114 through low pass filter (LPF) 109.

PWM signal 120 has a frequency that is typically higher than 20 kHz, causing the switching frequency of output signal 122 to also be above 20 kHz, which is above the human's audible range. LPF 109 generally filters out the switching noise generated by output signal 122.

FIG. 2 shows a schematic diagram of another conventional class-D amplifier 200 for driving audio speaker 114. Class-D amplifier 200 operates in a similar manner as class-D amplifier 100. Class-D amplifier 200, however, includes integrator 202 coupled to comparator for driving comparator 102 based on audio input signal 116 and feedback resistor 210 coupled between the output of output stage 105 and integrator 202.

During normal operation, the square-wave output of output stage 105 is summed with audio input signal 116 to provide negative feedback. Integrator circuit 202 provides the resulting signal into comparator 102, which operates in a similar manner as in class-D amplifier 100.

SUMMARY

In accordance with an embodiment, a class-D amplifier includes an input terminal configured to receive an input signal; a comparator having an input coupled to the input terminal; a deglitching circuit having an input coupled to an output of the comparator; and a driving circuit having an input coupled to an output of the deglitching circuit. The deglitching circuit includes a logic circuit coupled between the input of the deglitching circuit and the output of the deglitching circuit. The logic circuit is configured to receive a clock signal having the same frequency as the switching frequency of the class-D amplifier.

In accordance with an embodiment, a class-D amplifier includes: a fully-differential pre-amplifier circuit having first and second input terminals configured to receive an input signal and first and second output terminals configured to generate an amplified signal based on the input signal; a first integrator having an input terminal coupled to the first output terminal of the fully-differential pre-amplifier circuit; a second integrator having an input terminal coupled to the second output terminal of the fully-differential pre-amplifier circuit; a first comparator having an input terminal coupled to an output terminal of the first integrator; a second comparator having an input terminal coupled to an output terminal of the first integrator; first and second deglitching circuits having input terminals coupled to output terminals of the first and second comparators, respectively; and first and second driving circuits having input terminals coupled to output terminals of the first and second deglitching circuits, respectively. Each of the first and second deglitching circuits include: a first deglitching input terminal configured to receive a first signal, a deglitching output terminal, and a logic circuit coupled between the first deglitching input terminal and the deglitching output terminal.

In accordance with an embodiment, a method of deglitching in an audio class-D amplifier includes: receiving an input signal with the audio class-D amplifier; generating a first signal based on the input signal; comparing the first signal with a reference signal to generate a pulse-width modulation (PWM) signal; deglitching the PWM signal to produce a deglitched PWM signal; and driving an output stage of the audio class-D amplifier with the deglitched PWM signal. Deglitching the PWM signal includes: receiving a clock signal, set the deglitched PWM signal to a first state when the PWM has the first state and the clock signal is has the first state, set the deglitched PWM signal to a second state when the PWM has the second state and the clock signal is has the second state, and keep a same state of the deglitched PWM signal when the PWM signal has the first state and the clock signal has the second state, or when the PWM signal has the second state and the clock signal has the first state.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5A and 5B show a schematic diagram and a truth table, respectively of deglitching circuits of FIG. 4, according to an embodiment of the present invention;

FIG. 6 shows a schematic diagram of the deglitching circuits of FIGS. 5A and 5B, according to an embodiment of the present invention;

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
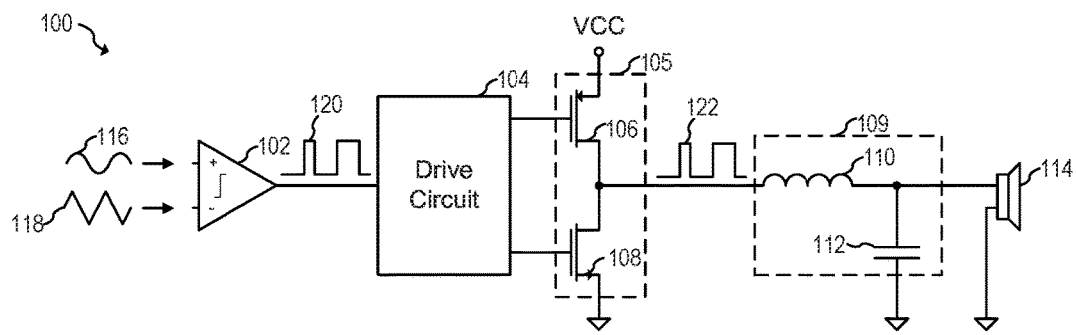
FIG. 1 shows a schematic diagram of a conventional class-D amplifier for driving an audio speaker.
Figure 2:
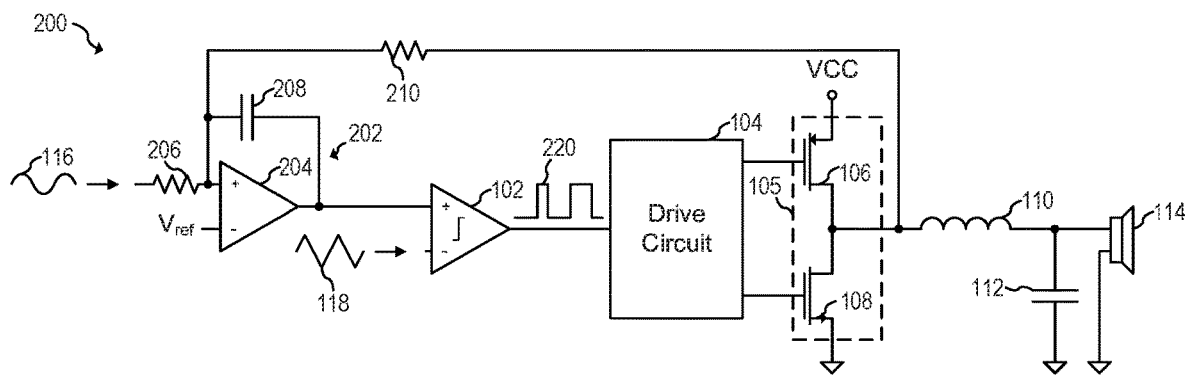
FIG. 2 shows a schematic diagram of another conventional class-D amplifier for driving an audio speaker.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The present invention will be described with respect to embodiments in a specific context, an audio class-D amplifier having a deglitching filter. Embodiments of the present invention may be used in other circuits, such as non-audio class-D amplifiers, and other PWM modulation class-D architectures, for example.

In an embodiment of the present invention, a class-D amplifier includes a deglitching circuit configured to remove glitches, e.g., caused by spikes in the power supply rail or ground references, without using an additional high frequency clock and without using a low-pass filter at the output of the comparator. By avoiding the use of an additional high-frequency clock, some embodiments advantageously achieve lower power consumption with a less complex circuit. By avoiding the use of a low-pass filter, some embodiments advantageously avoid any distortion that the low-pass filter may add.

Conventional class-D amplifiers, such as conventional class-D amplifiers 100 and 200, may exhibit occasional glitches at the output of comparator 102. Such glitches may be caused, for example, by spikes in the power supply rail or ground reference of the comparator. The glitches at the output of the comparator may generation audible distortion and an increase in power dissipation, which, in some scenarios, may cause damage to the amplifier. Conventional ways to remove such glitches includes using an additional high frequency clock to sample the PWM signal at the output of comparator 102, and using a low-pass filter coupled to the output of comparator 102 to filter out such glitches.

In an embodiment of the present invention, a deglitching circuit is coupled between the output of the comparator and the drive circuit and is implemented with digital logic.

Figure 3B:
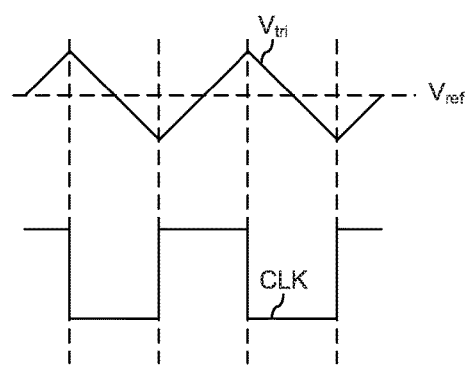
FIG. 3B shows waveforms of the audio class-D amplifier of FIG. 3A, according to an embodiment of the present invention.
Figure 3A:
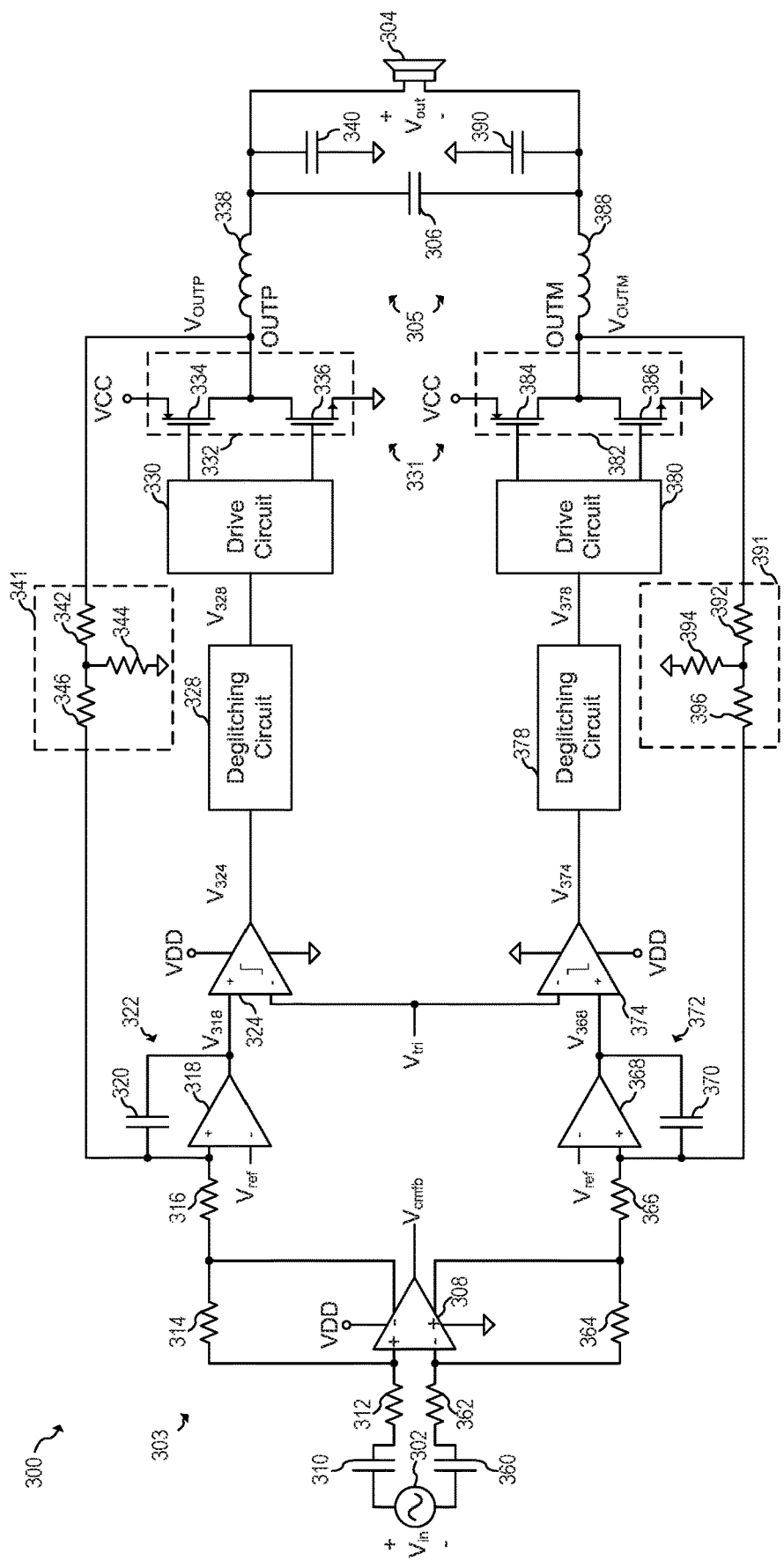
FIG. 3A shows a schematic diagram of an audio class-D amplifier, according to an embodiment of the present invention.

FIG. 3A shows a schematic diagram of audio class-D amplifier 300, according to an embodiment of the present invention. Audio class-D amplifier 300 includes fully-differential pre-amplifier 308, integrator circuits 322 and 372, comparators 324 and 374, deglitching circuits 328 and 378, drive circuits 330 and 380, output stage 331 that includes half-bridges 332 and 382, output filter 305, and feedback networks 341 and 391. Audio class-D amplifier 300 operates as a bridge tied-load (BTL) amplifier.

During normal operation, fully-differential pre-amplifier 308 receives audio input $V_{in}$ and generates a corresponding differential amplified input signal. Integrators 322 and 372 receive the respective amplified input signals and integrate them to generate respective signals $V_{318}$ and $V_{368}$. PWM signals $V_{OUTP}$ and $V_{OUTM}$ at respective outputs of half-bridges 332 and 382 are respectively fed back to integrators 322 and 372 to cause audio-class-D amplifier 300 to operate in closed-loop mode, which generally improves performance, such as improving total harmonic distortion (THD) and power supply rejection ratio (PSRR), for example.

Comparators 324 and 374 respectively receive signals $V_{318}$ and $V_{368}$ from integrators 322 and 372 and compare them with triangular signal $V_{tri}$ to generate PWM signals $V_{324}$ and $V_{374}$, respectively. Triangular signal $V_{tri}$ operates at the same frequency as clock signal CLK (as shown in FIG. 3B). In some embodiments, clock signal CLK is used to generate triangular signal $V_{tri}$.

PWM signals $V_{324}$ and $V_{374}$ are respectively deglitched by deglitching circuits 328 and 378 to generate deglitched PWM signals $V_{328}$ and $V_{378}$, respectively. Deglitched PWM signals $V_{328}$ and $V_{378}$ respectively drive circuits 330 and 380, which in turn drive half-bridges 332 and 382. Half-bridges 332 and 382 drive audio speaker 304 via output filter 305.

In some embodiments, input stage 303, which includes fully-differential pre-amplifier 308, comparators 318 and 368 and integrators 322 and 372 operate with power supply voltage VDD while output stage 331 operates with power supply voltage VCC. In some embodiments, voltage references $V_{cmfb}$ and $V_{ref}$ are constant (i.e., DC voltages) and are generated to be used as the DC level shift between input stage 303 and output stage 331. In some embodiments, power supply voltage VDD is at a voltage of 3.3 V while power supply voltage VCC is at voltage between 5 V to 36 V. Other voltages may be used.

Drive circuits 330 and 380 are used to drive half-bridges 332 and 382, respectively. For example, drive circuits 330 and 380 may be used to drive the control terminals corresponding high-side transistors 334 and 384, and low-side transistors 336 and 386. Drive circuits 330 and 380 may be implemented in any way known in the art.

Output stage 331 may be implemented in any way known in the art. For example, in some embodiments, transistors 334 and 384 are power metal-oxide-semiconductor field-effect transistors (MOSFETs) of the p-type, and transistors 336 and 386 are power MOSFETs of the n-type arranged in a bridge tied-load (BTL) structure.

Figure 4:
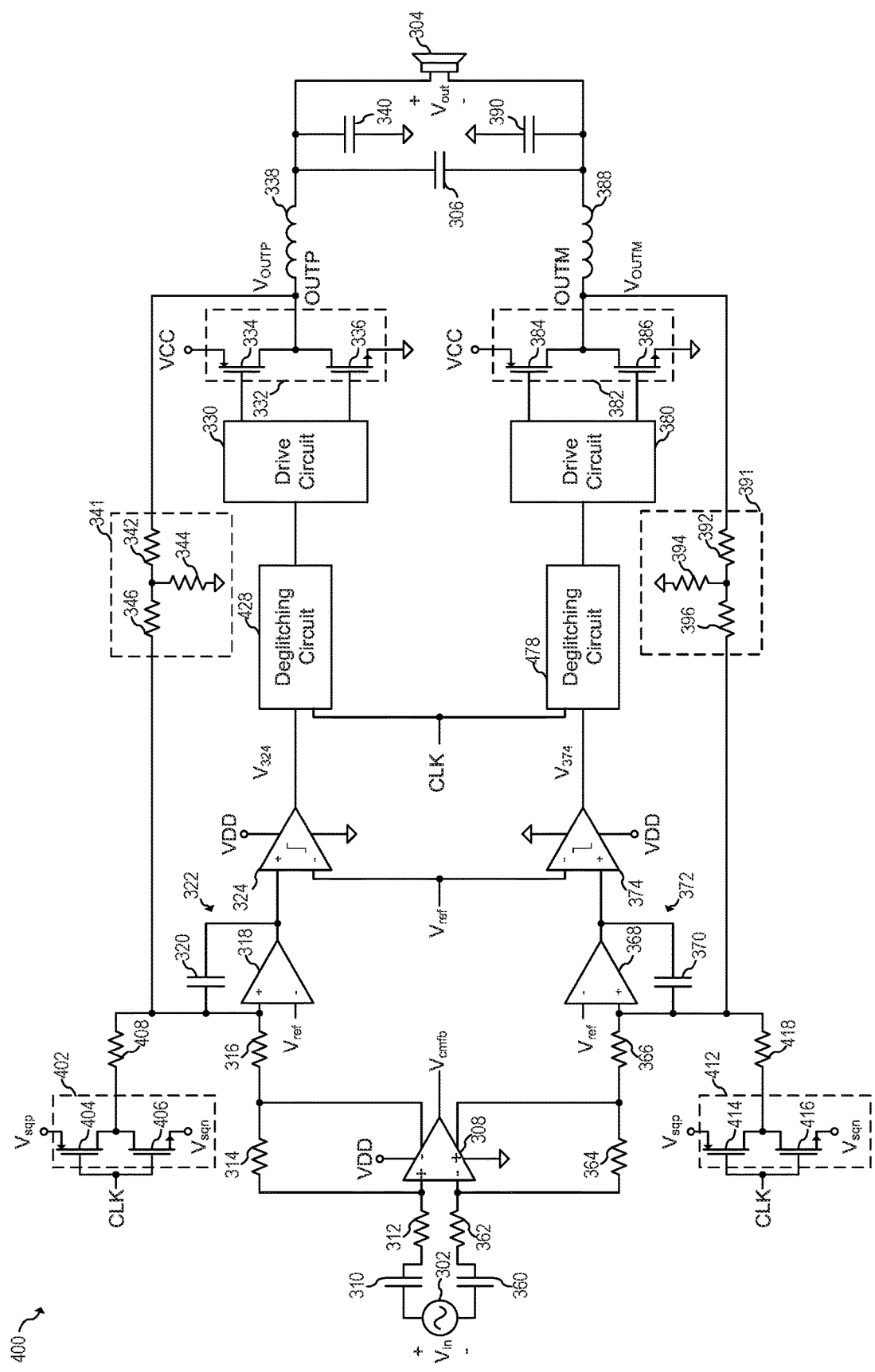
FIG. 4 shows a schematic diagram of an audio class-D amplifier, according to an embodiment of the present invention.

FIG. 4 shows a schematic diagram of audio class-D amplifier 400, according to an embodiment of the present invention. Audio class-D amplifier 400 operates in a similar manner as audio class-D amplifier 300. Audio class-D amplifier 400, however, has a triangle generator integrated in integrators 322 and 372. For example, during normal operation, inventers 402 and 412 switch transistors 404 and 406, and 414 and 416, respectively, to charge and discharge capacitors 320 and 370 respectively, to generate a triangle wave $V_{tri}$ at the output of integrators 322 and 372, respectively. It is understood that the triangle wave $V_{tri}$ generated by integrators 322 and 372 is superimposed at the output of such integrators with other signals being integrated by the integrators, such as signals from feedback networks 341 and 391.

Inverters 402 and 412 are coupled to reference voltages $V_{sqp}$ and $V_{sqn}$, as shown in FIG. 4. Reference voltage $V_{sqp}$ may be given by $V_{sqp}=V_{ref}+V_{sq}$, and reference voltage $V_{sqn}$ may be given by $V_{sqn}=V_{ref}-V_{sq}$, where $V_{sq}$ is a another reference voltage, and where the peak-to-peak voltage of the triangular signal generated by integrators 322 and 372 is $$V_{pp} = \frac{V_{sq} \cdot T}{2 \cdot R_{sq} \cdot C}.$$

where T is the period of clock signal CLK, C is the capacitance of capacitors 320 and 370, respectively, and $R_{sq}$ is the resistance of resistors 408 and 418, respectively.

Deglitching circuits 428 and 478 respectively receive PWM signals $V_{324}$ and $V_{374}$ and clock signal CLK. FIGS. 5A and 5B show a schematic diagram and a truth table, respectively, of deglitching circuits 502, according to an embodiment of the present invention. Deglitching circuits 428 and 478 may each be implemented as deglitching circuit 502.

As shown in FIG. 5B, when input signal $S_{in}$ is high and clock signal CLK is high, then output signal $S_{out}$ is high. When input signal $S_{in}$ is low and clock signal CLK is low, then output signal $S_{out}$ is low. When either input signal $S_{in}$ or clock signal CLK transitions such that the state of one of input signal $S_{in}$ or clock signal CLK is higher and the other of input signal $S_{in}$ or clock signal CLK is low, the output signal $S_{out}$ keeps its previous state. As shown in FIG. 5B, and as also illustrated, e.g., in FIG. 7, only one pulse may be delivered from input signal $S_{in}$ to output signal $S_{out}$ during one clock signal CLK period, thereby behaving like a filter that removes glitches at output signal $S_{out}$.

Deglitching circuit 502 may be implemented with digital logic. For example, FIG. 6 shows a schematic diagram of deglitching circuits 600, according to an embodiment of the present invention. Deglitching circuit 502 may be implemented as deglitching circuit 600. As shown in FIG. 6, deglitching circuit 600 includes NAND gate 602, NOR gate 606, inverter 604, and latch 608, which includes NOR gates 610 and 612.

Figure 7:
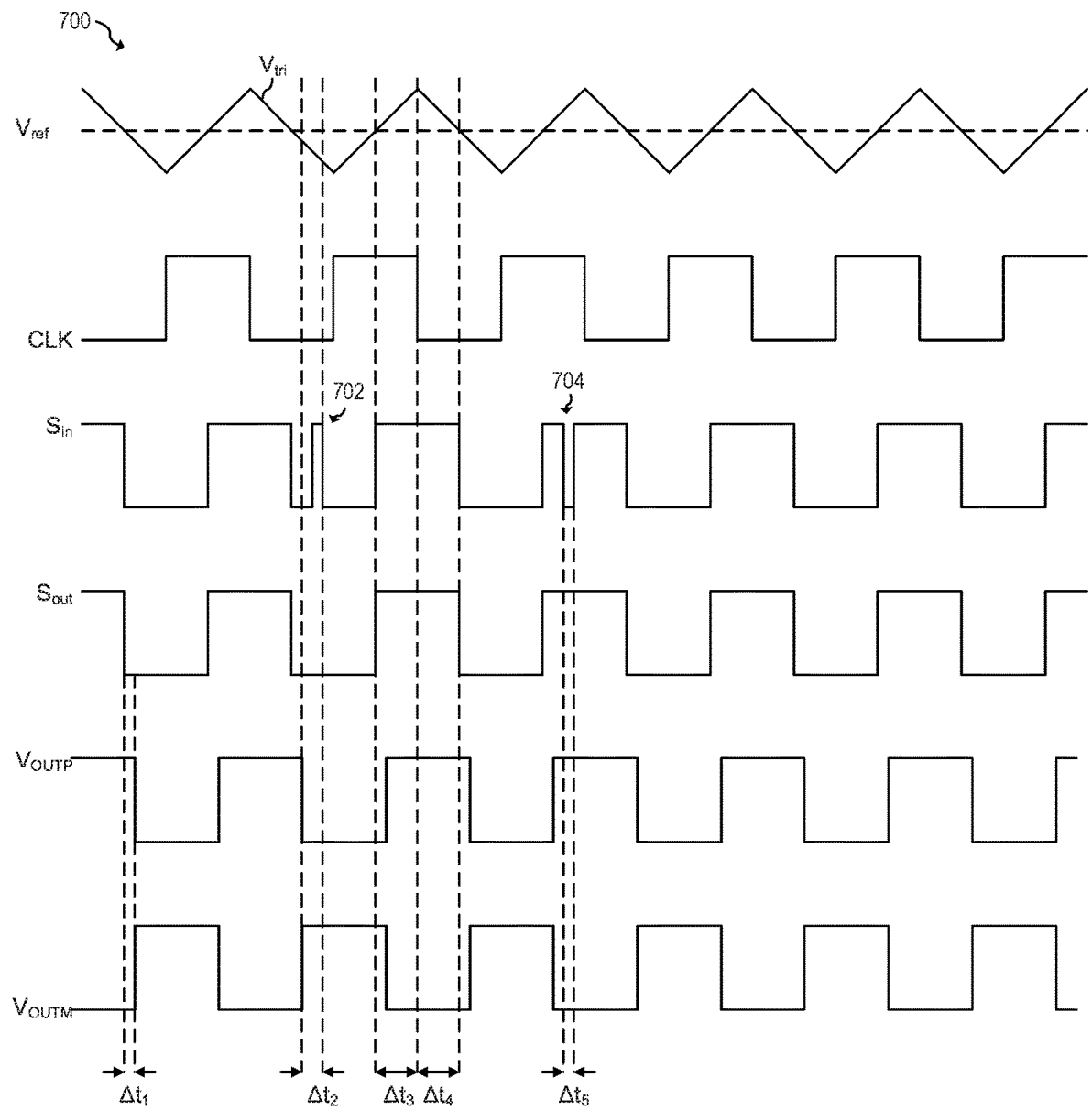
FIG. 7 shows waveforms of the deglitching circuit of FIG. 6, according to an embodiment of the present invention.

FIG. 7 shows waveforms 700 of deglitching circuit 600, according to an embodiment of the present invention. Waveforms 700 may also correspond to other implementations of truth table 500.

During normal operation, each time PWM signals $V_{OUTP}$ and $V_{OUTM}$ at outputs OUTP and OUTM transition (i.e., rise/fall edge), there is a chance that a glitch, such as glitch 702 or 704 is produced at the output of comparators 324 and 374 (i.e., at signal $S_{in}$), e.g., as a result of power supply rail or ground reference spikes. Glitch 702 may occur, e.g., during time $\Delta t_2$ after PWM signals $V_{OUTP}$ and $V_{OUTM}$ transition. Time $\Delta t_2$ may be, for example, between 10 ns and 100 ns. Shorter or longer times may also be possible.

When glitch 702 occurs at input signal $S_{in}$ during time $\Delta t_2$ after PWM signals $V_{OUTP}$ and $V_{OUTM}$ transition, glitch 702 is not propagated to output signal $S_{out}$ because the glitch causes input signal $S_{in}$ to transition from low to high and back to low at a time when clock signal CLK is low, which based on truth table 500 causes output signal $S_{out}$ to remain low. When glitch 704 occurs at input signal $S_{in}$ during time $\Delta t_2$ after PWM signals $V_{OUTP}$ and $V_{OUTM}$ transition, glitch 704 is not propagated to output signal $S_{out}$ because the glitch causes input signal $S_{in}$ to transition from high to low and back to high at a time when clock signal CLK is high, which based on truth table 500 causes output signal $S_{out}$ to remain high.

As shown in FIG. 7, there is a delay $\Delta t_1$ between output signal $S_{out}$ transitioning and PWM signals $V_{OUTP}$ and $V_{OUTM}$ transitioning. Delay $\Delta t_1$ may be caused by propagation delay of drive circuit 330.

The duration of glitch 702 and/or 704 may be, for example, time $\Delta t_5$. Time $\Delta t_5$ may be, for example, between 10 ns and 100 ns. Shorter or longer times are also possible.

Figure 8:
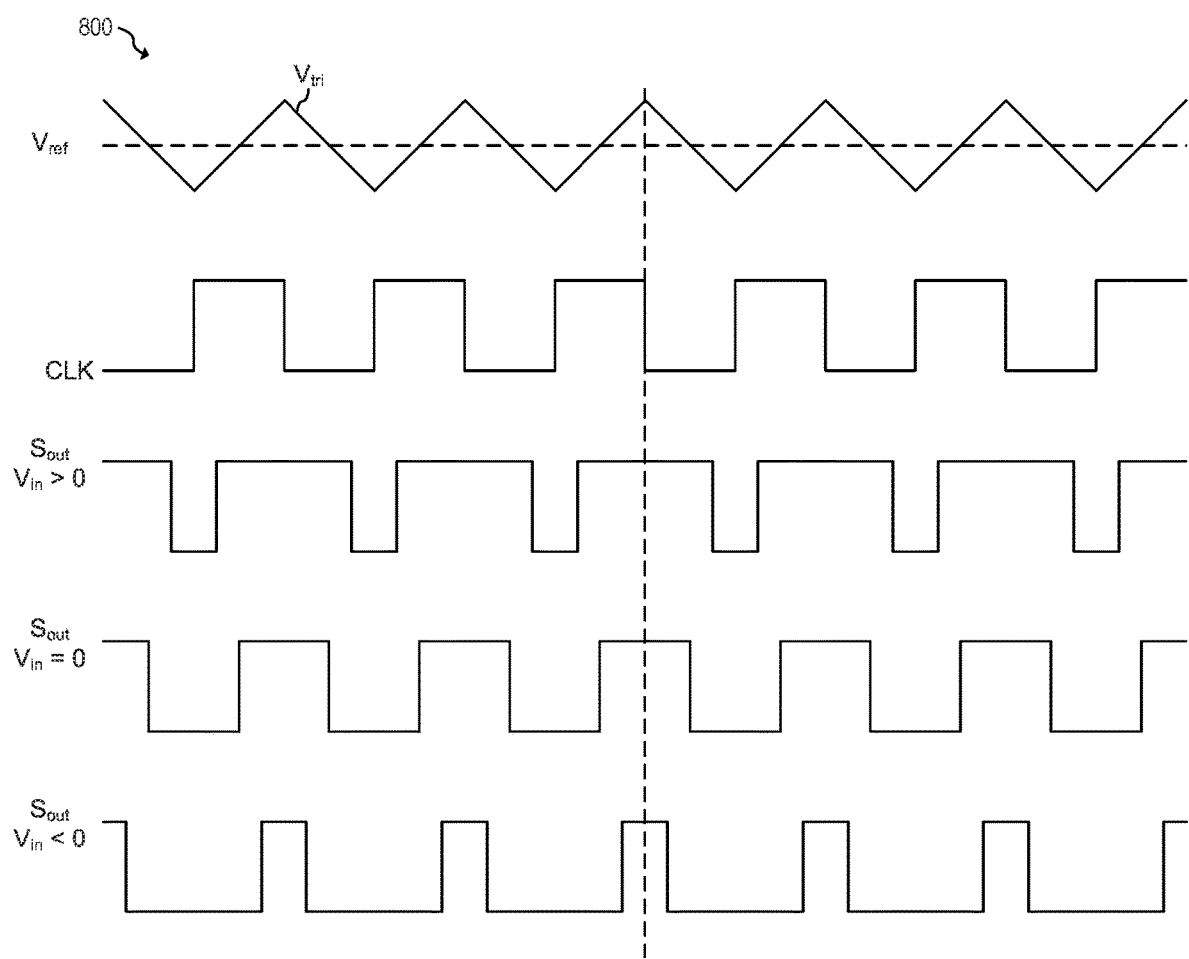
FIG. 8 shows waveforms of the deglitching circuit of FIG. 6 for different audio inputs, according to an embodiment of the present invention.

FIG. 8 shows waveforms of deglitching circuit 600 for different audio inputs $V_{in}$, according to an embodiment of the present invention. As shown in FIG. 8, the output signal has duty cycle higher than 50% when audio input signal $V_{in}$ is greater than 0 V, lower than 50% when audio input signal $V_{in}$ is lower than 0 V, and 50% when audio input signal $V_{in}$ is equal to 0 V.

As also shown in FIG. 8, the edge of clock signal CLK occurs at about the midpoint of the pulse of output signal $S_{out}$ (assuming no delay between input signal $S_{in}$ and clock signal CLK). In practice, some embodiments may exhibit some delay $t_d$ between input signal Sin and clock signal CLK. Delay $t_d$ may be given by $$t_d = t_{inv} + t_{int} + t_{comp} \quad (1)$$

where $t_{inv}$ corresponds to the propagation time of inverter 402 or 412, $t_{int}$ corresponds to the propagation time of integrator 322 or 372, and $t_{comp}$ corresponds to the propagation time of comparator 324 or 374. In some embodiments, $t_{inv}$ may be about 1 ns, $t_{int}$ may be about tens of ns, and $t_{comp}$ may be about tens of ns, such as 50 ns or lower. Other propagation times are also possible.

Figure 9:
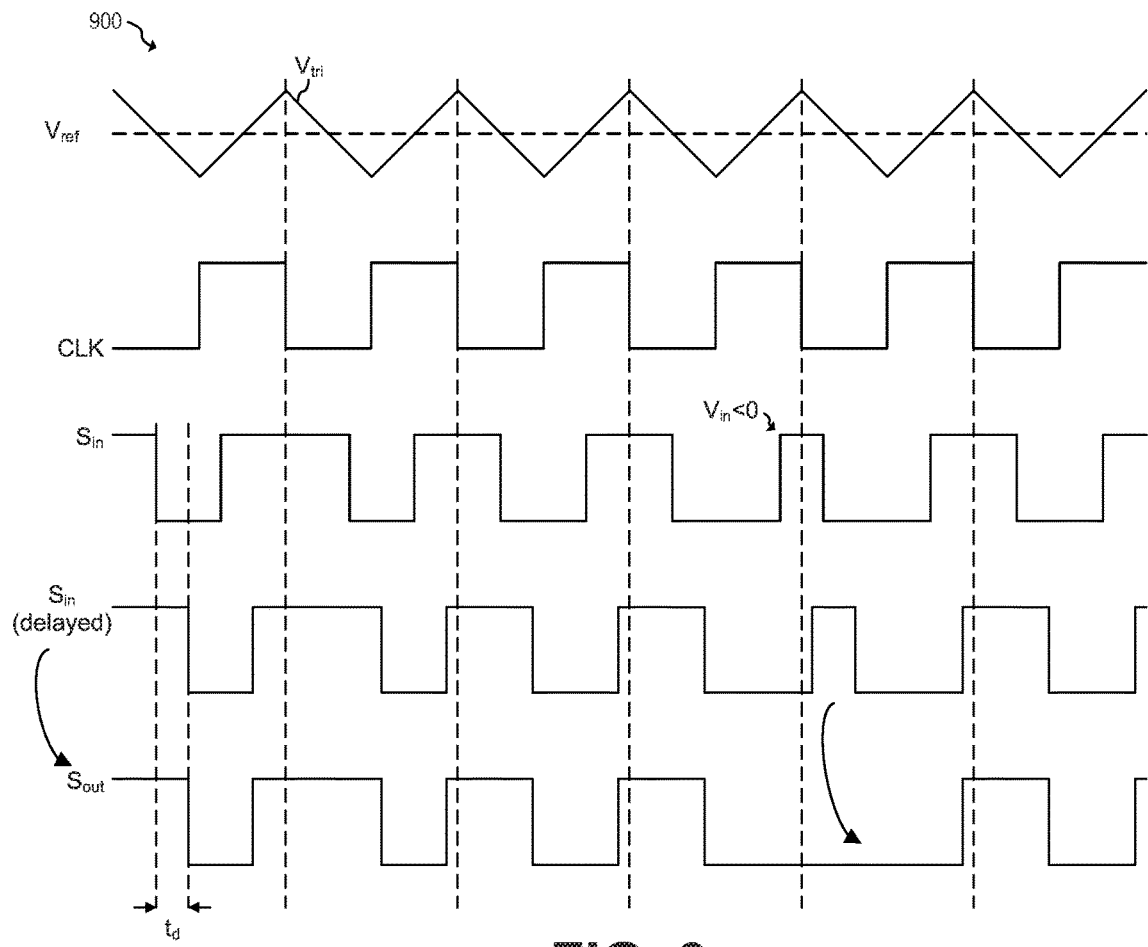
FIG. 9 shows waveforms of the deglitching circuit of FIG. 6 in the presence of a delay between an input signal and a clock signal, according to an embodiment of the present invention.
Figure 10:
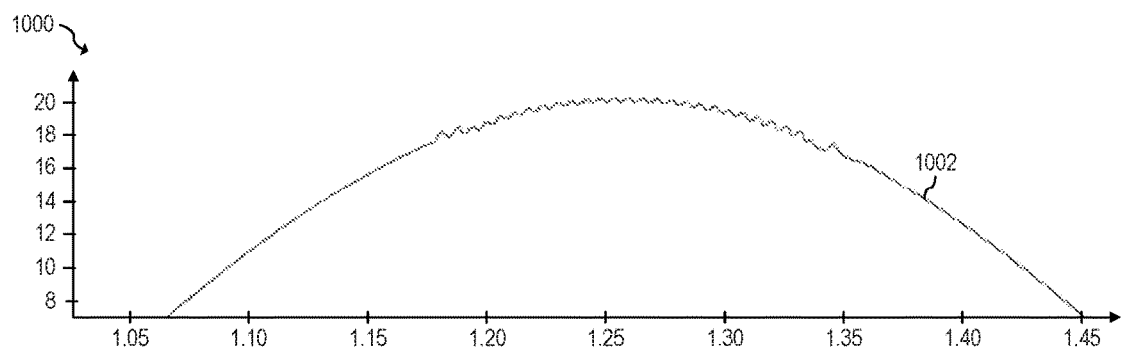
FIG. 10 shows a curve of output $V_{out}$ of the audio class-D amplifier of FIG. 4 when the deglitching circuits of FIG. 4 are implemented with the deglitching circuit of FIG. 6 and in the presence of a delay between an input signal and clock signal, according to an embodiment of the present invention.

FIG. 9 shows waveforms 900 of deglitching circuit 600 in the presence of a delay between input signal $S_{in}$ and clock signal CLK, according to an embodiment of the present invention. As shown in FIG. 9, small pulses when audio input $V_{in}$ is small may be lost as a result of the delay between input signal $S_{in}$ and clock signal CLK. The loss of such small pulses may result in audible distortion. For example, FIG. 10 shows curve 1002 of output $V_{out}$ of audio class-D amplifier 400 when deglitching circuits 428 and 478 are implemented with deglitching circuit 600 and in the presence of a delay between input signal $S_{in}$ and clock signal CLK, according to an embodiment of the present invention. Curve 1002 corresponds to output voltage Vout when audio input $V_{in}$ is a sinewave at 1 kHz and with a peak voltage of 1.67 V, and when power supply voltage VCC is equal to 24 V and audio speaker 304 is an 8Ω speaker.

Figure 11:
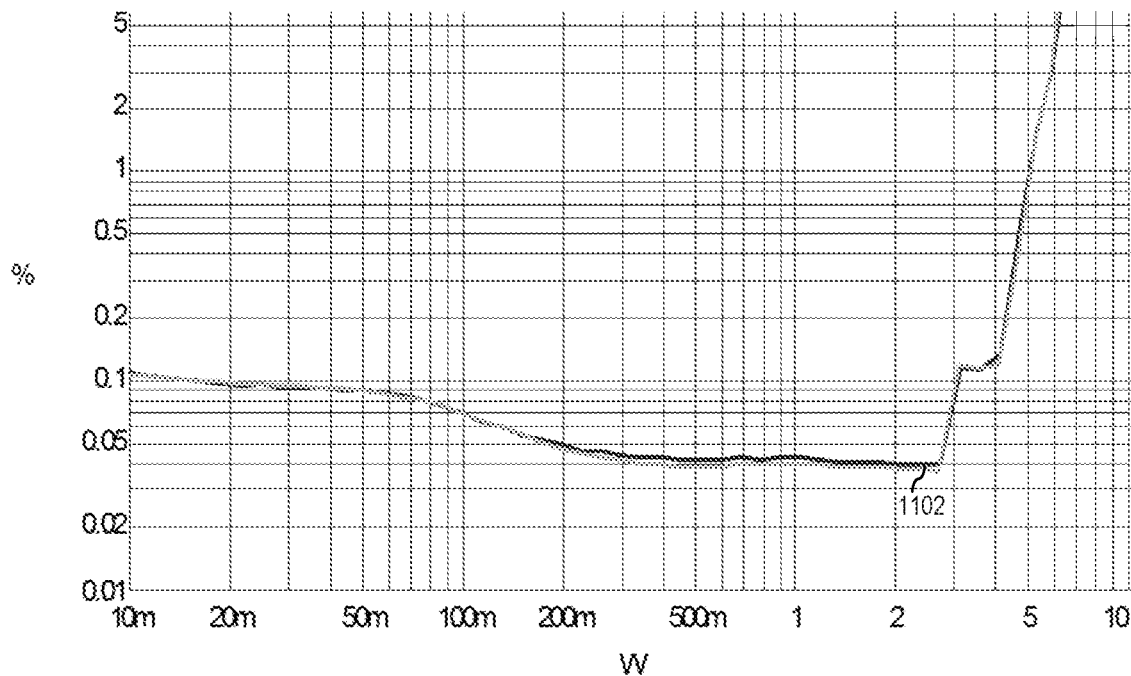
FIG. 11 shows a plot of THD versus power of the audio class-D amplifier of FIG. 4 when the deglitching circuits of FIG. 4 are implemented with the deglitching circuit of FIG. 6 and in the presence of a delay between an input signal and clock signal, according to an embodiment of the present invention.

As shown in FIG. 10, when audio input $V_{in}$ is small (e.g., near the positive or negative peak of the sinewave), distortion occurs as a result of the missing pulses. Such distortion may also be visible in a THD plot. For example, FIG. 11 shows a plot of THD versus power of audio class-D amplifier 400 when deglitching circuits 428 and 478 are implemented with deglitching circuit 600 and in the presence of a delay between input signal $S_{in}$ and clock signal CLK, according to an embodiment of the present invention. Curve 1102 corresponds to an audio input $V_{in}$ at 1 kHz when power supply voltage VCC is equal to 10 V and audio speaker 304 is an 8Ω speaker.

As shown in FIG. 11, there is an abrupt worsening of the THD around 2.8 W. Such abrupt worsening is due, in part, to missing pulses when audio input $V_{in}$ is small.

Figure 12:
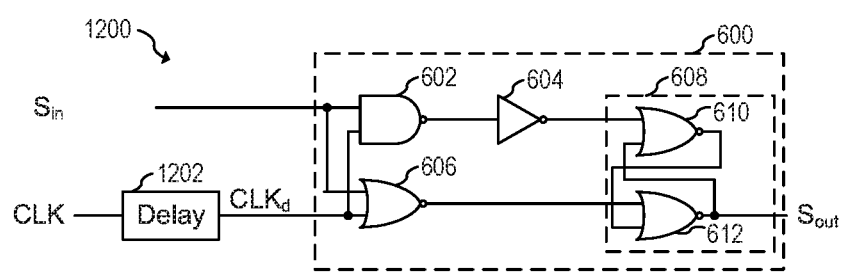
FIG. 12 shows a schematic diagram of a deglitching circuits, according to an embodiment of the present invention.

FIG. 12 shows a schematic diagram of deglitching circuits 1200, according to an embodiment of the present invention. Deglitching circuit 502 may be implemented as deglitching circuit 1200. Deglitching circuit 1200 operates in a similar manner as deglitching circuit 600. For example, truth table 500 also represents the behavior of deglitching circuit 1200. Deglitching circuit 1200, however, includes delay circuit 1202.

Delay circuit 1202 produces delayed clock signal $CLK_d$. The delay introduced by delay circuit 1202 compensates for the delay $t_d$ of input signal $S_{in}$. Delay circuit 1202 may be implemented in any way known in the art. For example, in some embodiments, delay circuit 1202 may be implemented by one or more buffers or inverters connected in series. Other implementations, such as using flip-flops or other digital or analog implementations are also possible.

Figure 13:
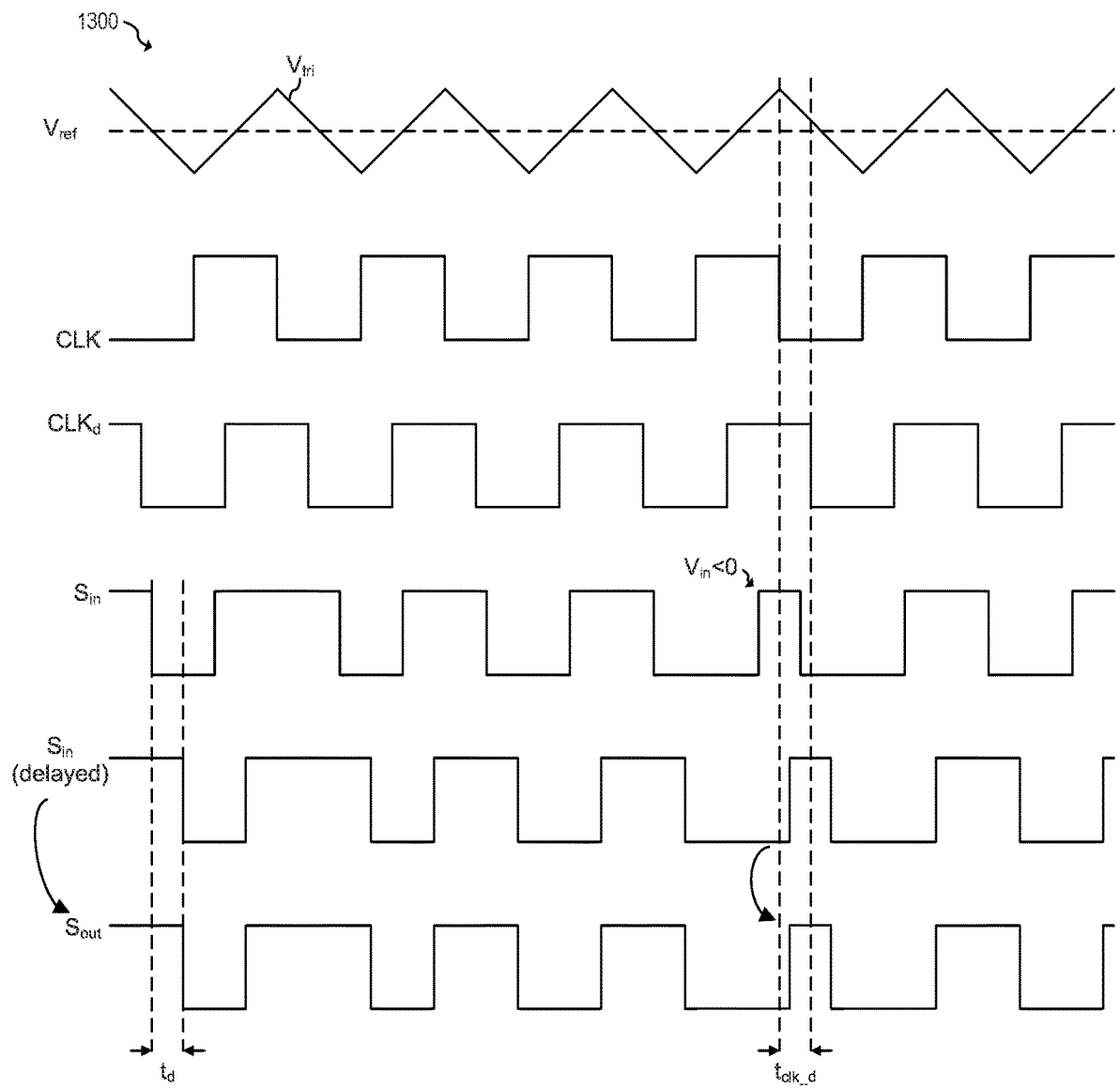
FIG. 13 shows waveforms of the deglitching circuit of FIG. 12 in the presence of a delay between an input signal and a clock signal, according to an embodiment of the present invention.

By compensating delay $t_d$, deglitching circuit 1200 advantageously allows for removing glitches caused, e.g., by spikes in the power supply rail or ground references, without distorting the audio signal by missing small pulses. For example, FIG. 13 shows waveforms 1300 of deglitching circuit 1200 in the presence of a delay between input signal $S_{in}$ and clock signal CLK, according to an embodiment of the present invention. Waveforms 1300 are produced in a similar manner as waveforms 900, except that deglitching circuit 1200 is used instead of deglitching circuit 600.

As shown in FIG. 13, clock delay $t_{clk\_d}$ compensates for the delay $t_d$ of input signal $S_{in}$ such that small pulses are not missed. In some embodiments, clock delay $t_{clk\_d}$ is equal to delay $t_d$ of input signal $S_{in}$. Clock delay $t_{clk\_d}$ may be given by $$t_{clk\_d} = t_{inv} + t_{int} + t_{comp} \quad (2)$$

where $t_{inv}$ corresponds to the propagation time of inverter 402 or 412, $t_{int}$ corresponds to the propagation time of integrator 322 or 372, and $t_{comp}$ corresponds to the propagation time of comparator 324 or 374. In some embodiments, clock delay $t_{clk\_d}$ may be slightly bigger than delay $t_d$, such as 1% to 10% bigger. Other clock delay $t_{clk\_d}$ times are also possible. For example, in some embodiments, the clock delay $t_{clk\_d}$ time is determined by estimating $t_{inv}$, $t_{int}$, and $t_{comp}$ over different processing corners, different temperatures, etc., (e.g., using Monte-Carlo simulations), and selecting a clock delay $t_{clk\_d}$ time such that $t_{clk\_d} \geq t_{inv} + t_{int} + t_{comp}$ for the different scenarios.

In some embodiments, the clock delay $t_{clk\_d}$, after applying Equation 2, may be smaller than 100 ns. Bigger or smaller clock delays are also possible. For example, in embodiments in which the frequency of clock CLK is 400 kHz, the clock delay $t_{clk\_d}$ may be as high as 150 ns or higher. For example, in some embodiments, the clock delay $t_{clk\_d}$ may be as high as 10% of the period of the clock CLK, or higher. The frequency of clock CLK may be, for example, between 100 kHz and 4 MHz. Higher or lower frequencies are also possible.

By removing glitches while avoiding missing small pulses, distortion and THD performance may advantageously be improved. For example, FIG. 14 shows a comparison between curve 1002 of output $V_{out}$ of audio class-D amplifier 400 when deglitching circuits 428 and 478 are implemented with deglitching circuit 600, and curve 1402 of output $V_{out}$ of audio class-D amplifier 400 when deglitching circuits 428 and 478 are implemented with deglitching circuit 1200, according to an embodiment of the present invention.

Figure 14:
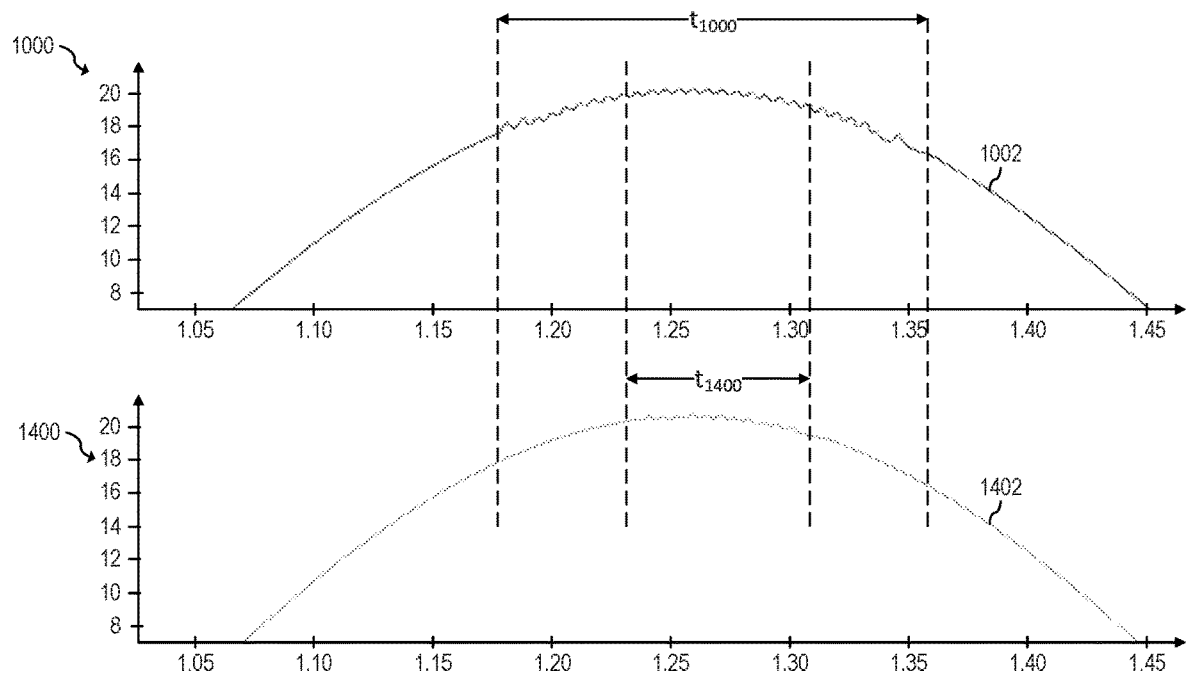
FIG. 14 shows a comparison between the curve of FIG. 10 and a curve of output $V_{out}$ of the audio class-D amplifier of FIG. 4 when the deglitching circuits of FIG. 4 are implemented with the deglitching circuit of FIG. 12, according to an embodiment of the present invention.
Figure 15:
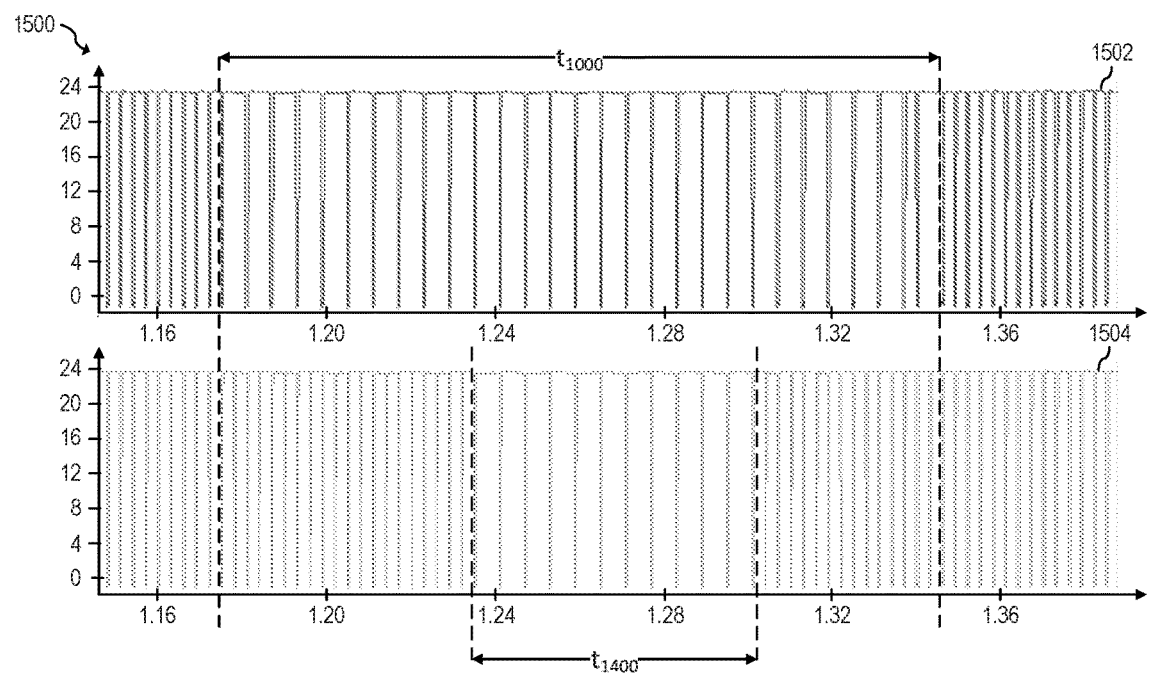
FIG. 15 shows first and second curves, which corresponds to voltage PWM signal $V_{OUTP}$ associated with the curves of FIG. 14, respectively, according to an embodiment of the present invention.

As shown in FIG. 14, distortion time $t_{1400}$, which corresponding to deglitching circuit 1200, is smaller than distortion time $t_{1000}$, which corresponds to deglitching circuit 1200. FIG. 15 shows curves 1502 and 1504, which corresponds to PWM signal $V_{OUTP}$ associated with curves 1002 and 1402, respectively, according to an embodiment of the present invention.

As shown in FIG. 15, fewer pulses are lost when deglitching circuit 1200 is used instead of deglitching circuit 600. For example, the pulses lost in curve 1502 may correspond to output stage 105 clipping and to missing pulses of deglitching circuit 600 while the pulses lost in curve 1504 may correspond only to output stage 105 clipping (i.e., no pulses lost due to deglitching circuit 1200).

Figure 16:
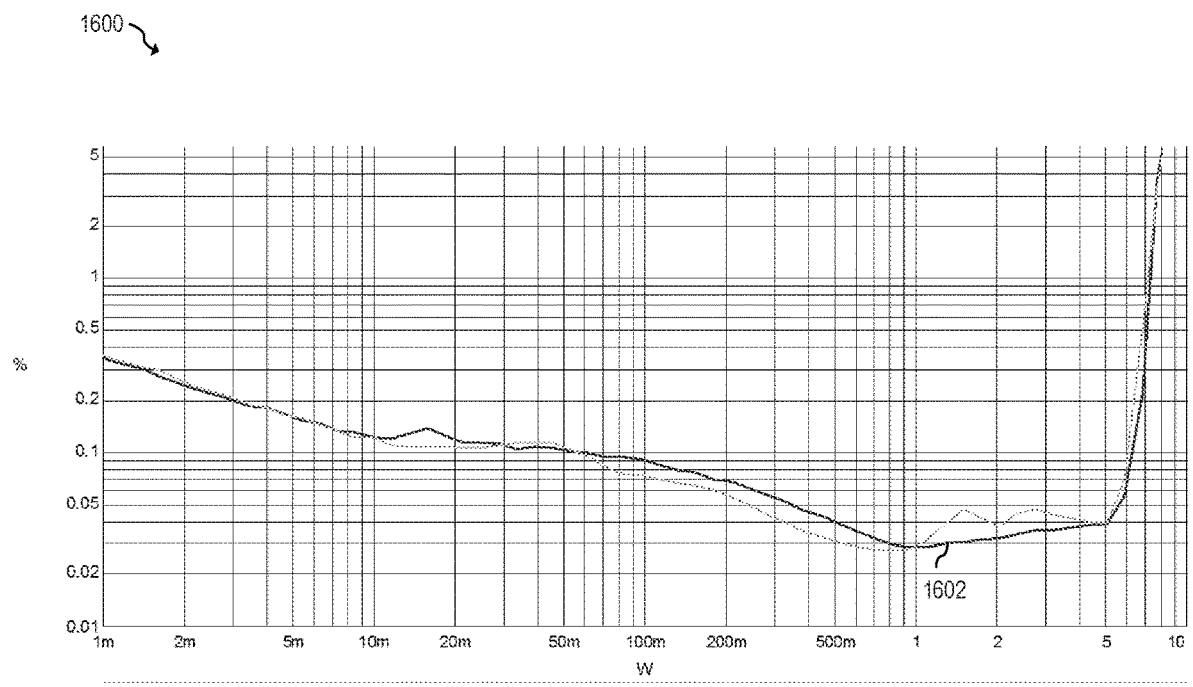
FIG. 16 shows a plot of THD versus power of the audio class-D amplifier of FIG. 4 when the deglitching circuits of FIG. 4 are implemented with the deglitching circuit of FIG. 12, according to an embodiment of the present invention.

FIG. 16 shows a plot of THD versus power of audio class-D amplifier 400 when deglitching circuits 428 and 478 are implemented with deglitching circuit 1200, according to an embodiment of the present invention. As shown in FIG. 16, there is no abrupt worsening of the THD around 2.8 W, when compared to the THD plot of FIG. 11.

Advantages of some embodiments include that glitches at the output of the comparator may be removed by using a simple deglitching circuit that does not introduce additional distortion. In some embodiments, the deglitching circuit may be implemented with digital logic only.

Example embodiments of the present invention are summarized here. Other embodiments can also be understood from the entirety of the specification and the claims filed herein.

Example 1

A class-D amplifier including: an input terminal configured to receive an input signal; a comparator having an input coupled to the input terminal; a deglitching circuit having an input coupled to an output of the comparator; and a driving circuit having an input coupled to an output of the deglitching circuit, where the deglitching circuit includes a logic circuit coupled between the input of the deglitching circuit and the output of the deglitching circuit, the logic circuit configured to receive a clock signal having a same frequency as the switching frequency of the class-D amplifier.

Example 2

The class-D amplifier of example 1, where the logic circuit includes a latch.

Example 3

The class-D amplifier of one of examples 1 or 2, where the deglitching circuit includes only digital logic circuitry.

Example 4

The class-D amplifier of one of examples 1 to 3, where the deglitching circuit does not introduce a phase delay based on a frequency of the input signal.

Example 5

The class-D amplifier of one of examples 1 to 4, where the logic circuit includes a second input configured to receive the clock signal, and where the deglitching circuit is configured to produce at the output of the deglitching circuit: a 0 when the input is 0 and the second input is 0; a 1 when the input is 1 and the second input is 1; and keep a previous state of the output of the deglitching circuit when the input is 0 and the second input is 1 or when the input is 1 and the second input is 0.

Example 6

The class-D amplifier of one of examples 1 to 5, where the logic circuit further includes: a NAND gate having a first input coupled to the input of the logic circuit and a second input coupled to the second input of the logic circuit; a NOR gate having a first input coupled to the input of the logic circuit and a second input coupled to the second input of the logic circuit; an inverter having an input coupled to an output of the NAND gate; and a latch having a first input coupled to an output of the inverter and a second input coupled to an output of the NOR gate.

Example 7

The class-D amplifier of one of examples 1 to 6, where the deglitching circuit includes a delay circuit having an output coupled to the second input of the logic circuit.

Example 8

The class-D amplifier of one of examples 1 to 7, where the delay circuit is configured to cause a delay of the clock signal that is smaller than 50 ns.

Example 9

The class-D amplifier of one of examples 1 to 8, further including an output stage coupled to the driving circuit, the driving circuit configured to drive the output stage.

Example 10

The class-D amplifier of one of examples 1 to 9, further including an audio speaker coupled to the output stage.

Example 11

A class-D amplifier including: a fully-differential pre-amplifier circuit having first and second input terminals configured to receive an input signal and first and second output terminals configured to generate an amplified signal based on the input signal; a first integrator having an input terminal coupled to the first output terminal of the fully-differential pre-amplifier circuit; a second integrator having an input terminal coupled to the second output terminal of the fully-differential pre-amplifier circuit; a first comparator having an input terminal coupled to an output terminal of the first integrator; a second comparator having an input terminal coupled to an output terminal of the first integrator; first and second deglitching circuits having input terminals coupled to output terminals of the first and second comparators, respectively; and first and second driving circuits having input terminals coupled to output terminals of the first and second deglitching circuits, respectively, where each of the first and second deglitching circuits include: a first deglitching input terminal configured to receive a first signal, a deglitching output terminal, and a logic circuit coupled between the first deglitching input terminal and the deglitching output terminal.

Example 12

The class-D amplifier of example 11, where the logic circuit includes a latch.

Example 13

The class-D amplifier of one of examples 11 or 12, where each of the first and second deglitching circuits include only digital logic circuitry.

Example 14

The class-D amplifier of one of examples 11 to 13, where none of the first and second deglitching circuit introduce a phase delay based on a frequency of the input signal.

Example 15

The class-D amplifier of one of examples 11 to 14, where the logic circuit includes a clock input terminal configured to receive a clock signal, and where each deglitching circuit is configured to produce at the deglitching output terminal, respectively: a first state when the first signal has the first state and the clock signal has the first state; a second state when the first signal has the second state and the clock signal has the second state; and keep a previous state of the deglitching output terminal when the first signal has the first state and the clock signal has the second state or when the first signal has the second state and the clock signal has the first state.

Example 16

The class-D amplifier of one of examples 11 to 15, where the logic circuit further includes: a NAND gate having a first input terminal coupled to the first deglitching input terminal and a second input terminal coupled to the clock input terminal; a NOR gate having a first input terminal coupled to the first deglitching input terminal and a second input terminal coupled to the clock input terminal; an inverter having an input terminal coupled to an output terminal of the NAND gate; and a latch having a first input terminal coupled to an output terminal of the inverter and a second input terminal coupled to an output terminal of the NOR gate.

Example 17

The class-D amplifier of one of examples 11 to 16, further including: a first inverter having an input terminal configured to receive the clock signal and an output terminal coupled the input terminal of the first integrator; and a second inverter having an input terminal configured to receive the clock signal and an output terminal coupled the input terminal of the second integrator.

Example 18

The class-D amplifier of one of examples 11 to 17, where each of the first and second deglitching circuits include a delay circuit having an input terminal coupled to the clock input terminal, the delay circuit configured to receive the clock signal and generate a delayed clock signal.

Example 19

The class-D amplifier of one of examples 11 to 18, further including an output stage and an audio speaker coupled to output stage, the first and second driving circuits coupled to the output stage to drive the output stage.

Example 20

A method of deglitching in an audio class-D amplifier, the method including: receiving an input signal with the audio class-D amplifier; generating a first signal based on the input signal; comparing the first signal with a reference signal to generate a pulse-width modulation (PWM) signal; deglitching the PWM signal to produce a deglitched PWM signal; and driving an output stage of the audio class-D amplifier with the deglitched PWM signal, where deglitching the PWM signal includes: receiving a clock signal, set the deglitched PWM signal to a first state when the PWM has the first state and the clock signal is has the first state, set the deglitched PWM signal to a second state when the PWM has the second state and the clock signal is has the second state, and keep a same state of the deglitched PWM signal when the PWM signal has the first state and the clock signal has the second state, or when the PWM signal has the second state and the clock signal has the first state.

Example 21

The method of example 20, where generating the first signal includes amplifying the input signal with a fully-differential pre-amplifier circuit.

Example 22

The method of one of examples 20 or 21, where the reference signal is a constant voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A class-D amplifier comprising:
    an input terminal configured to receive an input signal;
    a comparator having an input coupled to the input terminal;
    a deglitching circuit having an input coupled to an output of the comparator; and
    a driving circuit having an input coupled to an output of the deglitching circuit, wherein the deglitching circuit comprises a logic circuit coupled between the input of the deglitching circuit and the output of the deglitching circuit, the logic circuit configured to receive a clock signal having a same frequency as a switching frequency of the class-D amplifier, wherein the logic circuit comprises a second input configured to receive the clock signal, and wherein the deglitching circuit is configured to produce at the output of the deglitching circuit:
    a 0 when the input is 0 and the second input is 0;
    a 1 when the input is 1 and the second input is 1; and
    keep a previous state of the output of the deglitching circuit when the input is 0 and the second input is 1 or when the input is 1 and the second input is 0.

2. The class-D amplifier of claim 1, wherein the logic circuit comprises a latch.

3. The class-D amplifier of claim 1, wherein the deglitching circuit comprises only digital logic circuitry.

4. The class-D amplifier of claim 1, wherein the deglitching circuit does not introduce a phase delay based on a frequency of the input signal.

5. The class-D amplifier of claim 1, wherein the logic circuit further comprises:
    a NAND gate having a first input coupled to the input of the logic circuit and a second input coupled to the second input of the logic circuit;
    a NOR gate having a first input coupled to the input of the logic circuit and a second input coupled to the second input of the logic circuit;
    an inverter having an input coupled to an output of the NAND gate; and
    a latch having a first input coupled to an output of the inverter and a second input coupled to an output of the NOR gate.

6. The class-D amplifier of claim 1, wherein the deglitching circuit comprises a delay circuit having an output coupled to the second input of the logic circuit.

7. The class-D amplifier of claim 6, wherein the delay circuit is configured to cause a delay of the clock signal that is smaller than 50 ns.

8. The class-D amplifier of claim 1, further comprising an output stage coupled to the driving circuit, the driving circuit configured to drive the output stage.

9. The class-D amplifier of claim 8, further comprising an audio speaker coupled to the output stage.

10. A class-D amplifier comprising:
    a fully-differential pre-amplifier circuit having first and second input terminals configured to receive an input signal and first and second output terminals configured to generate an amplified signal based on the input signal;
    a first integrator having an input terminal coupled to the first output terminal of the fully-differential pre-amplifier circuit;
    a second integrator having an input terminal coupled to the second output terminal of the fully-differential pre-amplifier circuit;
    a first comparator having an input terminal coupled to an output terminal of the first integrator;
    a second comparator having an input terminal coupled to an output terminal of the first integrator;

first and second deglitching circuits having input terminals coupled to output terminals of the first and second comparators, respectively; and first and second driving circuits having input terminals coupled to output terminals of the first and second deglitching circuits, respectively, wherein each of the first and second deglitching circuits comprise:
a first deglitching input terminal configured to receive a first signal,
a deglitching output terminal, and
a logic circuit coupled between the first deglitching input terminal and the deglitching output terminal, the logic circuit comprising a latch.

11. The class-D amplifier of claim 10, wherein each of the first and second deglitching circuits comprise only digital logic circuitry.

12. The class-D amplifier of claim 10, wherein neither of the first and second deglitching circuits introduces a phase delay based on a frequency of the input signal.

13. The class-D amplifier of claim 10, wherein the logic circuit comprises a clock input terminal configured to receive a clock signal, and wherein each deglitching circuit is configured to produce at the deglitching output terminal, respectively:
a first state when the first signal has the first state and the clock signal has the first state;
a second state when the first signal has the second state and the clock signal has the second state; and
keep a previous state of the deglitching output terminal when the first signal has the first state and the clock signal has the second state or when the first signal has the second state and the clock signal has the first state.

14. The class-D amplifier of claim 13, wherein the logic circuit further comprises:
a NAND gate having a first input terminal coupled to the first deglitching input terminal and a second input terminal coupled to the clock input terminal;
a NOR gate having a first input terminal coupled to the first deglitching input terminal and a second input terminal coupled to the clock input terminal;
an inverter having an input terminal coupled to an output terminal of the NAND gate, wherein the latch has a first input terminal coupled to an output terminal of the inverter and a second input terminal coupled to an output terminal of the NOR gate.

15. The class-D amplifier of claim 14, further comprising:
a first inverter having an input terminal configured to receive the clock signal and an output terminal coupled the input terminal of the first integrator; and
a second inverter having an input terminal configured to receive the clock signal and an output terminal coupled the input terminal of the second integrator.

16. The class-D amplifier of claim 13, wherein each of the first and second deglitching circuits comprise a delay circuit having an input terminal coupled to the clock input terminal, the delay circuit configured to receive the clock signal and generate a delayed clock signal.

17. The class-D amplifier of claim 10, further comprising an output stage and an audio speaker coupled to output stage, the first and second driving circuits coupled to the output stage to drive the output stage.

18. A method of deglitching in an audio class-D amplifier, the method comprising:
receiving an input signal with the audio class-D amplifier;
generating a first signal based on the input signal;
comparing the first signal with a reference signal to generate a pulse-width modulation (PWM) signal;
deglitching the PWM signal to produce a deglitched PWM signal; and
driving an output stage of the audio class-D amplifier with the deglitched PWM signal, wherein deglitching the PWM signal comprises:
receiving a clock signal,
setting the deglitched PWM signal to a first state when the PWM has the first state and the clock signal has the first state,
setting the deglitched PWM signal to a second state when the PWM has the second state and the clock signal has the second state, and
keeping a same state of the deglitched PWM signal when the PWM signal has the first state and the clock signal has the second state, or when the PWM signal has the second state and the clock signal has the first state.

19. The method of claim 18, wherein generating the first signal comprises amplifying the input signal with a fully-differential pre-amplifier circuit.

20. The method of claim 18, wherein the reference signal is a constant voltage.

21. The method of claim 18, further comprising delaying the clock signal before deglitching, wherein receiving the clock signal during the deglitching of the PWM signal comprises receiving the delayed clock signal.

22. The class-D amplifier of claim 1, wherein the comparator has a second input configured to receive a reference signal.

* * * * *